United States Patent [19]

DiLorenzo et al.

[11] 3,896,473

[45] July 22, 1975

[54] GALLIUM ARSENIDE SCHOTTKY BARRIER AVALANCE DIODE ARRAY

[75] Inventors: James Vincent DiLorenzo, Piscataway; William Charles Niehaus; Daniel Leon Rode, both of Murray Hill, all of N.J.

[73] Assignee: Bell Telephone Laboratories, Incorporated, Murray Hill, N.J.

[22] Filed: Dec. 4, 1973

[21] Appl. No.: 421,521

[52] U.S. Cl. .......... 357/15; 331/94.5 H; 331/107 R; 357/13; 357/18; 357/56; 357/69; 357/75

[51] Int. Cl. .......... H01l 1/12; H01l 1/18

[58] Field of Search ....... 317/234 H, 234 N, 234 W, 317/234 V, 235 AJ, 235 AK; 357/3, 55, 56, 69, 75, 76, 15, 13; 331/107 R, 107 G, 107 T

[56] References Cited

UNITED STATES PATENTS

| | | | |
|---|---|---|---|
| 3,074,145 | 1/1963 | Rowe | 317/234 N |
| 3,389,457 | 6/1968 | Goldman et al. | 317/234 N |
| 3,469,209 | 9/1969 | Mosher | 317/235 V |
| 3,566,214 | 2/1971 | Usuda | 317/234 N |
| 3,689,993 | 9/1972 | Tolar | 317/234 V |
| 3,691,476 | 9/1972 | Hayashi | 317/235 N |
| 3,740,617 | 6/1973 | Teramoto et al. | 317/235 AK |
| 3,755,752 | 8/1973 | Kim | 317/235 UA |
| 3,758,875 | 9/1973 | Hayashi | 317/235 N |
| 3,761,783 | 9/1973 | Kroger et al. | 317/235 AJ |

OTHER PUBLICATIONS

Swan, Proc. IEEE, Sept. 1967, pp. 1617–1618 (vol. 55).

S.M. Sze, Physics of Semiconductor Devices, Wiley-Interscience, N.Y. 1969, page 702.

*Primary Examiner*—William D. Larkins
*Attorney, Agent, or Firm*—P. V. D. Wilde

[57] ABSTRACT

Gallium arsenide power dissipating devices are described, which comprise an array of mesas formed on a plated heat sink in order to reduce thermal effects. The array is connected in parallel with beam leads to permit thermocompression bonding to only one of the mesas and thus reduce the number of bonding operations. Bonding stresses to the device may be eliminated by rendering one of the mesas inactive.

1 Claim, 8 Drawing Figures

PATENTED JUL 22 1975

3,896,473

SHEET 2

GALLIUM ARSENIDE SCHOTTKY BARRIER AVALANCE DIODE ARRAY

BACKGROUND OF THE INVENTION

1. Field of the Invention

The invention is concerned with power dissipating devices such as GaAs mesa diodes used as Gunn oscillators, IMPATT diodes, diode lasers, light emitting diodes, etc. More particularly, the invention is concerned with reducing the effects of thermal and bonding stresses in such diodes.

2. Description of the Prior Art

Semiconductive power dissipating devices, particularly the GaAs IMPATT diodes and GaAs lasers, are presently the subject of intensive investigations. A common problem associated with these devices, as described in greater detail below, is the stresses created by thermocompression (TC) bonding of contact leads and heat sinks to the devices.

a. IMPATT Diodes

IMPATT (IMPact ionization Avalanche Transit Time) diodes employ impact ionization (or avalanche multiplication) and transit time properties of semiconductor structures to produce negative resistance at microwave frequencies. As is well-known, an IMPATT diode may be used to generate microwave radiation when it is mounted in a microwave cavity and biased into reverse avalanche breakdown.

In the usual GaAs Schottky barrier mesa IMPATT diode, a Schottky barrier contact layer, typically of platinum, is formed on one surface of an active region, in which microwave power is generated. Typically, an ohmic contact is formed on the opposite surface, usually through a contact region. For example, in an n-$n^+$-$n^{++}$ structure, the $n^{++}$ layer, usually a GaAs substrate having an impurity concentration of about $10^{18}$ atoms/$cm^3$, comprises the ohmic contact region. The $n^+$ layer, which is an epitaxial GaAs layer formed on one surface of the $n^{++}$ layer and having an impurity concentration of about $10^{17}$ atoms/$cm^3$ to $10^{18}$ atoms/$cm^3$, comprises a buffer region. The n layer, which is an epitaxial GaAs layer formed on the $n^+$ layer and having an impurity concentration of about $10^{15}$ atoms/$cm^3$ to $10^{17}$ atoms/$cm^3$, comprises the active region. Following a reduction in thickness of the $n^{++}$ substrate by lapping and polishing, the ohmic contact is formed on the exposed surface of the $n^{++}$ layer. Typically, the ohmic contact comprises a gold-germanium alloy, capped with a nickel layer. The Schottky barrier side of the structure is then gold plated and fused by TC bonding to a gold plated heat sink, typically diamond or copper, and the ohmic contact side is fused by TC bonding to a wire lead. A more complete description of the structure may be found in Vol. 59, *Proceedings of the IEEE*, pp. 1,212–1,215 (1971).

However, several problems have been noted that have tended to result in low process yields. First, the devices tend to develop excessive heat during operation at microwave frequencies. Second, the high heat and stress involved in the TC bonding steps have tended to result in low process yields. Third, lapping and polishing of the contact region (e.g., the $n^{++}$ substrate in the n-$n^+$-$n^{++}$ structure) to achieve a final uniform thickness of the device is found to be time-consuming and often results in mechanical damage, thus also reducing process yield.

Diamond heat sinks have usually been used in an attempt to dissipate excessive heat resulting from high current densities employed during device operation. More recently, electroplated heat sink technology, using either gold or silver, has come into use. Proposals have also been made to alter the structure of the mesa diode itself in order to dissipate such heat. For example, annular rings of area equal to a single mesa diode have been fabricated. Various geometric arrays are also known, in many cases, with individual leads TC bonded to each diode in the array; see, e.g., Goldman et al, U.S. Pat. No. 3,389,457, issued June 25, 1968.

On the other hand, the reduction of stresses resulting from the TC bonding steps to the wire leads and from the polishing and lapping steps does not appear to have received much attention.

b. Laser Diodes

GaAs lasers are presently the subject of investigation for potential use in a variety of applications, including optical communication systems. These devices may be divided into two categories: the homostructure and heterostructure devices. The homostructure device consists primarily of a region of n-type GaAs adjacent to a region of p-type GaAs to form a single p-n junction. In the basic single heterostructure device, a layer of p-type GaAs is sandwiched between a region of n-type GaAs and a region of p-type AlGaAs. Another form of heterostructure, the double heterostructure laser, comprises an active layer of n- or p-type GaAs sandwiched between a layer of n-type AlGaAs and a layer of p-type AlGaAs with a region of n-type GaAs (usually an $n^{++}$ substrate upon which all other layers are epitaxially formed) adjacent to the n-type AlGaAs and, preferably, a region of p-type GaAs formed adjacent to the p-type AlGaAs for ease of ohmic contacting. The advantages of the double heterostructure are the improved confinement of the injected electrons, which results in lower threshold current densities, and the improved optical confinement, which results in light emission essentially only from the active region.

Lasing is made possible in the diode lasers by cleaving two opposite surfaces of the device which are perpendicular to the p-n junction. These mirror surfaces internally reflect light produced by the device and thereby contribute to stimulated emission.

One problem associated with these devices has been their short lifetimes. It appears that some contributions to the deterioration may arise from stresses introduced by: (a) TC bonding one side of the device to a diamond heat sink and the other side to an ohmic contact, and (b) mechanical lapping and polishing of the substrate to a final desired thickness.

SUMMARY OF THE INVENTION

In accordance with the invention, TC bonding stresses are reduced and excessive heat is efficiently dissipated in III-V semiconductive power dissipating devices by a device structure, in which at least two mesas are formed on a plated heat sink. Beam leads are employed to connect the diodes in parallel.

In a preferred embodiment directed to IMPATT diodes, a plurality of mesa diodes are symmetrically disposed about a central mesa diode. The only TC bonding operation necessary is that to the central diode which, if desired, may be rendered electrically inactive.

In a preferred embodiment directed to diode lasers, a beam lead from the laser to an electrically inactive standoff mesa enables contact to the device to be made by TC bonding a lead to the standoff mesa.

Finally, in a preferred embodiment directed in general to III-V semiconductive power dissipating devices, lapping and polishing stresses are reduced by replacing the $n^{++}$ substrate with an $n^{++}$ epitaxial layer of the desired thickness. This is accomplished by interposing a layer of $Al_zGa_{1-z}As$ and a layer of $n^{++}$ GaAs between the $n^{++}$ substrate and the $n^+$ layer. A first selective etchant (an aqueous solution of hydrogen peroxide buffered with phosphoric acid) removes the $n^{++}$ substrate and a second selective etchant (hydrochloric acid) removes the $Al_zGa_{1-z}As$ layer.

DETAILED DESCRIPTION OF THE INVENTION

Figure 1A:
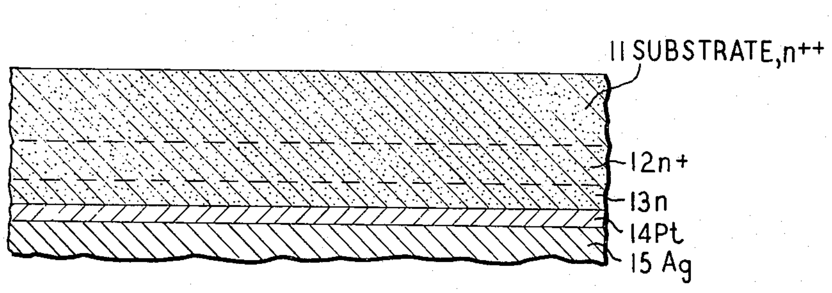
FIGS. 1A through 1E depict, in cross-section, fabrication of a semiconductive power dissipating device, here an IMPATT diode, in accordance with the invention.

The invention and Drawing are described in terms of the preferred embodiments, which are the fabrication and structure of (1) a GaAs Schottky barrier mesa IMPATT diode array and (2) a GaAs double heterostructure junction diode laser. The inventive structure may also advantageously be employed in other semiconductive power dissipating devices such as Gunn diodes, light emitting diodes, other varieties of IMPATT diodes and diode lasers, etc.

As used in this Application, a rectifying barrier includes p-n junctions and non-ohmic metal-semiconductor contacts.

1. IMPATT Diode

FIG. 1 shows a substrate 11 of GaAs having an impurity concentration of about $10^{18}$ atoms/cm$^3$, designated $n^{++}$. Substrate 11 forms a contact region. An epitaxial layer 12 of GaAs is deposited on substrate 11 to form a buffer region. Layer 12 has a somewhat lower impurity concentration of about $4 \times 10^{17}$ atoms/cm$^3$ and is designated $n^+$. Another epitaxial layer 13 of GaAs is deposited over layer 12, to form an active region. Layer 13 has an impurity concentration of about $10^{16}$ atoms/cm$^3$ and is designated n. The preparation of the substrate and the formation of the two epitaxial layers are performed by methods well-known in the art, and do not form a necessary part of this disclosure. Typically, the total thickness of the three layers is initially about 250 micrometers, with the thickness of the $n^+$ layer 12 being about 5 micrometers to 10 micrometers and the thickness of the n layer 13 being about 5 micrometers to 15 micrometers. Following metallization to form a rectifying Schottky barrier contact 14, as described more fully below, the $n^{++}$ substrate 11 is typically lapped to about 50 micrometers in thickness and reduced to 25 micrometers by chemical etching, using methods well-known in the art.

Preferably, mechanical stresses created by lapping and polishing the substrate may be reduced by interposing a multilayer structure (not shown) comprising a layer $Al_zGa_{1-z}As$, where $z$ is at least 0.3, of about 1 micrometer to 2 micrometers in thickness and a layer of $n^{++}$ GaAs of about 4 micrometers in thickness between the $n^{++}$ substrate 11 and the $n^+$ layer 12. The $n^{++}$ substrate is conveniently removed by a first selective etchant consisting of an aqueous solution of 20 percent hydrogen peroxide, buffered to a pH of about 7.5 to 8.5 with phosphoric acid. The $Al_zGa_{1-z}As$ layer is then removed by a second selective etchant of hydrochloric acid. The epitaxial $n^{++}$ layer then forms the contact region of the device.

Covering layer 13 is shown a layer 14 of platinum, which forms a Schottky barrier contact with the n-layer. The platinum layer, typically 0.2 micrometers to 0.6 micrometers in thickness, is conveniently deposited by well-known vacuum techniques, such as vacuum-sputtering. A heat sink layer 15, either of gold or of silver, is electroplated onto the platinum layer by methods well-known in the art to form an electrical and thermal contact to the platinum layer. Typically, gold is plated to a thickness of about 90 micrometers and lapped to about 75 micrometers in thickness, while silver is deposited to a thickness of about 150 micrometers and lapped to about 125 micrometers in thickness. Ultimately, the heat sink is bonded to a massive copper stud, as is well-known.

Figure 1B:
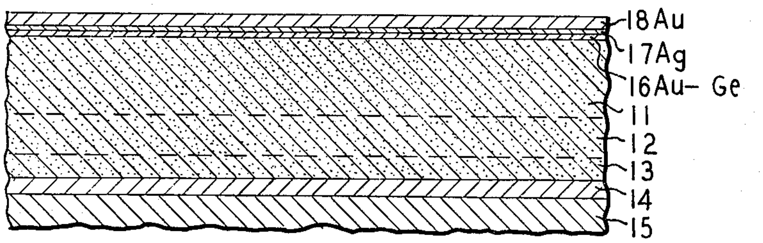

For highly doped contact regions—that is, where the impurity concentration in the $n^{++}$ layer is greater than about $10^{18}$ atoms/cm$^3$—a second Schottky barrier contact is usually employed, consisting of a layer of gold (not shown) deposited on the surface opposite the platinum layer 14 to a thickness of about 8 micrometers. Alternatively, where somewhat lower doping concentrations are employed in the contact region, an ohmic contact is preferred. A variety of ohmic contacts have been described in the literature. Some of these, however, occasionally ball up during contact formation and produce a high resistivity contact that is unsuitable for some applications. A metallization procedure that has been found to overcome this problem is shown in FIG. 1B. A gold-germanium layer 16 is first deposited onto the surface of layer 11, as is already well-known in the art. A silver layer 17, is deposited on the surface of layer 16 and is then capped with a gold layer 18. A convenient method for carrying out the deposition is to vacuum-evaporate the respective layers. For example, a solid button of a gold-germanium alloy having the composition of about 85 percent to 87 percent Au, balance Ge, is deposited on the surface of layer 11. Typically, the gold-germanium layer is deposited to a thickness of 0.05 micrometers to 0.075 micrometers. The silver layer is deposited to a thickness of about 0.08 micrometers to 0.12 micrometers, and prevents balling up of the gold-germanium layer during the subsequent contact-forming step. The entire surface is then capped with a gold layer of from 0.2 micrometers to 1 micrometer in thickness to prevent corrosion of silver. Alloying the contact is achieved by heating in a reducing atmosphere, such as hydrogen, using a rapid heating and cooling cycle. Since the gold-germanium-gallium arsenide eutectic lies between 340° C to 360° C, it is considered necessary to heat the assembly to at least 360° C in order to achieve bonding of the contact to the $n^{++}$ contact layer 11. Too high a temperature, however, causes severe diffusion and, consequently, results in poor device operation. Accordingly, a range of heating of 365° C to 400° C appears optimum. The time of heating must be kept short in order to prevent substantial diffusion into gallium arsenide, since copper, for example, present even in a few parts per million in the silver-gold-germanium components will convert n-type GaAs to p-type GaAs. The heating time thus desirably ranges from 1 second to 3 seconds. The above metallization procedure is appropriate where GaAs is doped with an n-type dopant, such as silicon. For p-type GaAs, where zinc, for example is the dopant, a gold-zinc composition could be substituted for the gold-germanium composition.

Figure 1C:
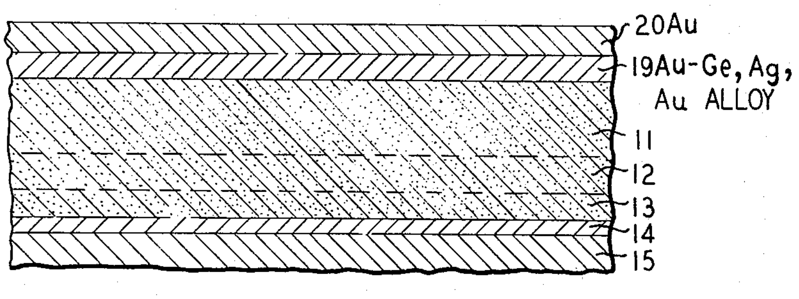
Figure 1D:
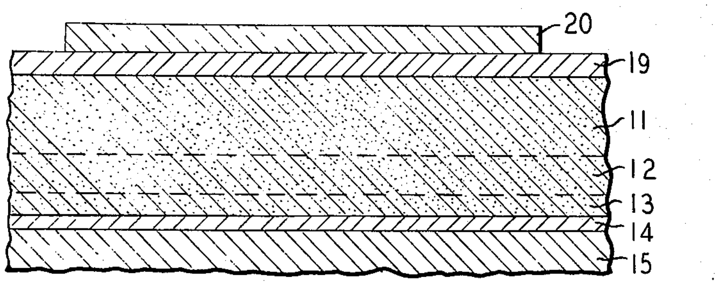
Figure 1E:
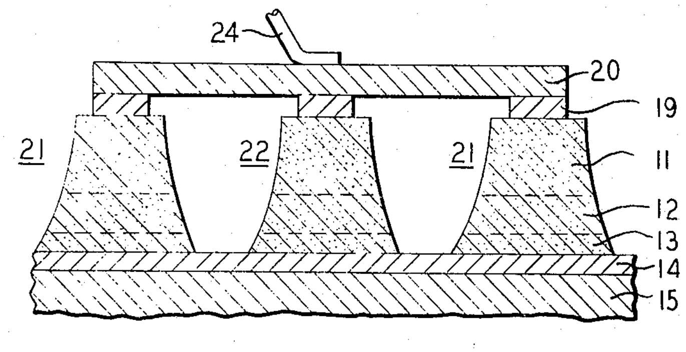

Following alloying of the contact to form contact layer 19, a comparatively thick layer 20 of gold is deposited to a thickness of about 8 micrometers, as shown in FIG. 1C. Using conventional photolithographic techniques, the gold layer 20 (and contact layer 19) is patterned, using etchants such as a solution of potassium iodide, in the final configuration which it is to have for interconnecting an array of mesa diodes with beam leads, resulting in the structure shown in FIG. 1D. At the same time that the gold layer 20 is patterned and etched, a pattern is registered in the heat sink, which is later used to separate the array of mesa diodes from surrounding arrays of mesa, as described below. A second photolithographic procedure is then employed to protect those portions of the GaAs structure which are to form the array of mesa diodes. The undesired portions of GaAs are then completely etched away using well-known etchants, such as bromine in methanol or $H_2SO_4$-$H_2O_2$-$H_2O$, to form the structure shown in FIG. 1E, in which the layer 20 forms a beam lead, interconnecting the individual mesa structures 21 and 22 as shown. The plated heat sink layer 15 supports the array of diodes.

It can be seen that the foregoing procedure may be followed to batch fabricate a plurality of arrays on one semiconductor slice. Separation of arrays is conveniently achieved by protecting the plurality of arrays, such as by embedding in wax. Following photolithographic procedures and using the previously registered pattern as a guide, portions of the heat sink layer are removed from the areas between the arrays by etching in a solution of potassium iodide. Where the heat sink is silver, a 2 micrometer layer of gold is then plated to protect the silver from corrosion. The platinum layer not only is chemically inert to the etchant, but also aids the gold encapsulation because of its continuity. The arrays are then separated in an ultrasonic bath, which cleaves the platinum layer 14 at the boundaries of the remaining portions of the heat sink layer.

Figure 2:
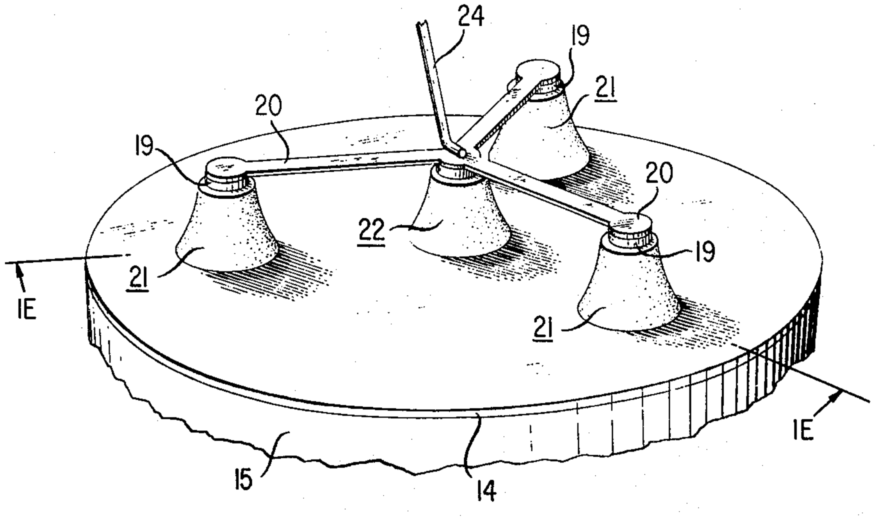
FIG. 2 depicts, in perspective, an array of semiconductive power dissipating IMPATT diodes, fabricated in accordance with the invention.

FIG. 2 shows a completed structure (not to scale), in which three mesa diodes 21 are symmetrically disposed about a central mesa diode 22. An electrode 24, such as a wire or ribbon lead, is thermocompression (TC) bonded to the gold layer 20 over the central diode. As an example, the distance between diodes is about 375 micrometers center to center. Each diode has a diameter of about 75 micrometers to 150 micrometers, depending on the desired frequency of diode operation (75 micrometers for 11 GHz, 150 micrometers for 6 GHz). In contrast, the diameter of prior art single mesa diodes range from 150 micrometers to 300 micrometers over the same frequency range. The beam clearance from the surface is about 25 micrometers and the beam width is about 25 micrometers.

It can be seen that a number of diodes may be symmetrically disposed about the central diode to form an array of diodes. While the number in the array described in this example is three, greater numbers of diodes in the array may also be fabricated.

In most applications, the device, following bonding to a package of some sort, is ready for use. However, there may occasionally be applications where lead impedance becomes a problem. In the structure as shown, four mesa diodes are connected in parallel. However, it should be noted that the impedance of the central mesa diode to the external circuitry is somewhat different from that of the surrounding three mesa diodes to the external circuitry, due to the shorter lead length of the central mesa to the external circuitry. Accordingly, in those applications where such impedance mismatch is of some concern, it may be considered useful to render the central mesa diode structure inactive, so that the external circuitry will experience only the equal impedances of the surrounding mesa diodes. The central mesa diode may be made inactive by a variety of techniques. For example, prior to performing the metallization sequence on the surface of layer 11, the surface may be passivated—such as by proton bombardment or by forming a thin oxide layer. The passivation also ensures a substantially stress-free structure from TC bonding effects.

It is also obvious that the mesas may be fabricated in a variety of configurations, such as a ring mesa diode surrounding and connected to a central stand-off mesa diode, etc., utilizing the combination of beam lead connection, TC bonding to one mesa diode and plated heat sink to reduce TC bonding stresses and excessive heat during operation.

2. Examples of IMPATT Diodes

A number of devices have been fabricated using a plated heat sink of either gold or silver. In the Table below, examples of several devices are given; all devices have three mesa diodes symmetrically disposed about an active central mesa diode. The total active area of the structure is compared with the size of a single disc equivalent mesa diode structure. The measured heat impedance in degrees per watt is given from the diode (D) to the plated heat sink (PHS) and from the plated heat sink to the base, together with the total heat dissipation. It is found that the multimesa structure formed on a plated heat sink dissipates heat more effectively than the single mesa TC bonded to a diamond heat sink. The r.f. performance in terms of power in watts, efficiency in percent, and operating frequency in GHz is also listed.

TABLE.

Performance of IMPATT Diodes Fabricated in Accordance with the Invention.

| Example | PHS | Size of Single Disc Equivalent, Micrometers | Measured Heat Dissipation °C/Watt D-PHS | PHS-Base | Total | R.F. Performance Power, Watts | Efficiency, % | Freq., GHz |
|---|---|---|---|---|---|---|---|---|
| 1 | Ag | 180 | — | — | — | 1.8 | 9.2 | 4.7 |
| 2 | Ag | 150 | — | — | — | 1.3 | 6.0 | 4.7 |
| 3 | Ag | 180 | — | — | — | 1.6 | 7.6 | 4.6 |
| 4 | Ag | 180 | — | — | — | 3.2 | 9.8 | 4.3 |

TABLE – Continued

Performance of IMPATT Diodes Fabricated in Accordance with the Invention.

| Example | PHS | Size of Single Disc Equivalent, Micrometers | Measured Heat Dissipation °C/Watt D-PHS | PHS-Base | Total | Power, Watts | R.F. Performance Efficiency, % | Freq., GHz |
|---|---|---|---|---|---|---|---|---|
| 5 | Au | 190 | — | — | — | 1.84 | 10.5 | 5.8 |
| 6 | Au | 200 | — | — | — | 2.01 | 10.1 | 5.8 |
| 7 | Au | 230 | 4.6 | 2.1 | 6.7 | — | — | — |
| 8 | Au | 200 | 6.3 | 2.0 | 8.3 | 1.7 | 12.0 | 5.8 |
| 9 | Au | 170 | 8.7 | 7.3 | 16.0 | — | — | — |
| 10 | Au | 140 | 11.3 | 2.3 | 13.6 | — | — | — |
| 11 | Ag | 190 | 3.3 | 2.9 | 6.2 | — | — | — |
| 12 | Au | 300 | 2.1 | 1.7 | 3.8 | — | — | — |
| 13 | Ag | 230 | 4.3 | 1.9 | 6.2 | — | — | — |
| 14 | Ag | 330 | 2.4 | 1.8 | 4.2 | — | — | — |
| 15 | Ag | 280 | — | — | — | 3.6 | 11.0 | 6.0 |
| 16 | Ag | 280 | — | — | — | 4.0 | 11.0 | 6.0 |
| 17 | Ag | 330 | 1.9 | 1.0 | 2.9 | — | — | — |
| 18 | Ag | 300 | 2.3 | 1.1 | 3.4 | — | — | — |
| 19 | Au | 250 | — | — | — | 6.81 | 12.6 | 4.7 |
| 20 | Au | 270 | — | — | — | 6.4 | 11.5 | 4.7 |
| 21 | Au | 250 | — | — | — | 7.3 | 13.5 | 4.6 |
| 22 | Au | 270 | — | — | — | 5.4 | 10.3 | 4.7 |
| 23 | Au | 165 | — | — | — | — | 16.5 | 11.1 |
| 24 | Au | 180 | — | — | — | 2.2 | 10.6 | 14.9 |
| 25 | Au | 220 | — | — | — | .8 | 9.4 | 12.8 |
| 26 | Au | 200 | — | — | — | 2.1 | 9.5 | 12.8 |

3. Double Heterostructure Junction Diode Laser

Figure 3:
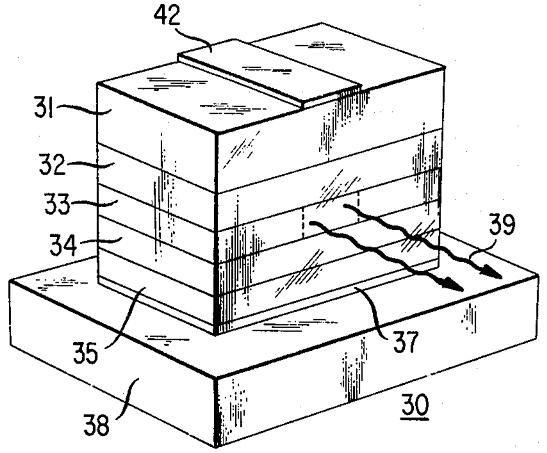
FIG. 3 depicts, in perspective, a double heterostructure junction laser.

FIG. 3, with the dimensions exaggerated for purposes of illustration, shows a substrate 31 of GaAs having an n-type impurity concentration of about 3 × $10^{18}$ atoms/cm$^3$, designated $n^{++}$. Substrate 31 forms a contact region. An epitaxial layer 32 of $Al_xGa_{1-x}As$, where $x$ ranges from 0.1 to 0.3, is formed on substrate 31. Layer 32 has a somewhat lower n-type impurity concentration of about 4 × $10^{17}$ atoms/cm$^3$ and is designated N. Another epitaxial layer 33 of GaAs is deposited over layer 32 to form an active region. Layer 33 has a p-type impurity concentration of about 4 × $10^{17}$ atoms/cm$^3$ and is designated p. Layers 32 and 33 thus form a p-n junction. An epitaxial layer 34 of $Al_yGa_{1-y}As$, where $y$ ranges from 0.1 to 0.3, is deposited over layer 33. Layer 34 has a p-type impurity concentration of about 3 × $10^{17}$ atoms/cm$^3$ and is designated P. An epitaxial layer 35 of GaAs is deposited over layer 34. Layer 35 has a p-type impurity concentration of about 2 to 4 × $10^{19}$ atoms/cm$^3$ and is designated $p^{++}$. The n-type layers are conveniently formed by doping with Te, while the p-type layers are conveniently formed by doping with Ge (or Zn). The preparation of the substrate and the formation of the four epitaxial layers are performed by methods well-known in the art and do not form a necessary part of this disclosure; see, e.g., I. Hayashi, U.S. Pat. No. 3,758,875, issued Sept. 11, 1973. Typically, the total thickness of the five layers is initially about 325 micrometers, with the thickness of the N layer 32 being about 1 to 3 micrometers, the thickness of the p layer 33 being about 0.1 to 0.3 micrometers, the thickness of the P layer 34 being about 0.5 to 1.5 micrometers and the thickness of the $p^{++}$ layer 35 being about 0.5 to 2 micrometers. Following metallization of the $p^{++}$ layer as described more fully below, the $n^{++}$ substrate 31 is usually lapped and polished to a thickness of about 15 micrometers, using methods well-known in the art.

Preferably, mechanical stresses caused by lapping and polishing the substrate may be reduced by interposing a multilayer structure (not shown) comprising a layer of $Al_zGa_{1-z}As$ of about 1 micrometer to 2 micrometers in thickness, where $z$ is at least 0.3, and a layer of $n^{++}$ GaAs of about 4 micrometers to 8 micrometers in thickness between the $n^{++}$ substrate 31 and the N layer 32, as discussed above in the section on IMPATT diodes.

A layer 37 of platinum or palladium is deposited over layer 34 to form a contact. The metal layer, typically 0.2 micrometers in thickness, is conveniently deposited by well-known vacuum techniques, such as vacuum-sputtering. For reasons related to efficiency of operation, heat dissipation, and current density, it is preferred to limit the width of a laser beam 39 as it emerges from the active region 33. This is done by forming an inactive layer 36, shown in FIG. 4, which may be formed (1) by proton bombardment as described in L. A. D'Asaro et al., Ser. No. 204,222, filed Dec. 2, 1971, now U.S. Pat. No. 3,824,133, or (2) by an oxide layer as described in R. A. Logan et al., Ser. No. 291,937, filed Sept. 25, 1972, now U.S. Pat. No. 3,833,435, or (3) by etching the entire p-type material on either side of the desired lasing region. In any event, a mesa stripe laser 41 is formed, typically about 15 micrometers wide.

A heat sink layer 38, either of gold or silver, is electroplated onto the metal layer 37 by methods well-known in the art to form an electrical and thermal contact to the metal layer. Typically, gold is plated to a thickness of about 90 micrometers and lapped to a thickness of about 75 micrometers, while silver is deposited to a thickness of 90 micrometers and lapped to a thickness of about 75 micrometers. Ultimately the heat sink is bonded to a massive copper stud (not shown).

An ohmic contact (not shown) is formed on the surface of the $n^{++}$ layer 31. Any of the ohmic contacts customarily used in the art may be employed, but if an epitaxial $n^{++}$ layer is used with palladium, no alloying is needed, and thermal expansion mismatch is avoided. Where layer 31 is epitaxially formed, a thin layer of palladium (not shown) of about 0.05 micrometers in thickness is used both for adhesion and as a barrier to gold diffusion from a gold layer 42, which is deposited to a thickness of about 2 micrometers to 4 micrometers. Using conventional photolithographic techniques, the gold layer 42 is patterned, using etchants such as a solution of potassium iodide, in the final configuration which it is to have for connecting the device 30 to a standoff mesa 43. A second photolithographic procedure is then employed to delineate the device and the standoff mesa. The undesired portions of GaAs and AlGaAs are then completely etched away using well-known etchants such as $H_2SO_4$-$H_2O_2$-$H_2O$ to form the structure shown in FIG. 4, in which the layer 42 forms a beam lead 42*b* connecting the device 30 and the standoff mesa 43. The plated heat sink layer 38 supports the diode laser assembly. A diode laser assembly may be separated from a batch fabricated plurality of assemblies using the procedure outlined above in the section on IMPATT diodes.

As an example, the distance between the diode laser 30 and the standoff mesa 43 is about 30 micrometers. The length of the unsupported portion of the beam lead 42*b* is about 30 micrometers and the width is about 8 micrometers to 10 micrometers. The diode laser has dimensions of about 80 micrometers wide, from 40 micrometers to 400 micrometers long, and from 8 micrometers to 10 micrometers high. The gold ohmic contact 42*a* is at least as wide as the stripe portion 41 of the laser (that is, about 15 micrometers). The diameter of the standoff mesa is about 100 micrometers.

The surface 45 of the standoff mesa 43, prior to the formation of the ohmic contact, is rendered inactive such as by proton bombardment or by forming an insulating oxide, whether native grown or deposited, as described above. Following delineation of the structure, an electrode 44, such as a wire or ribbon lead, is TC bonded to the gold layer 42*c* covering the standoff mesa, thus reducing stresses ordinarily found in prior art devices in which the lead is TC bonded to the top surface 42*a* of the device 30 itself.

In order to form a mirrored surface of the device, it is found advantageous to reduce the width of the metal layer 37 and plated heat sink 38 to such an extent that both ends of the device are cantilevered. The etching of the metal layers is conveniently done from the same side that the beam lead 42*b* is formed, since photolithography can be done over the device. Cleaving to form the mirrors may be done by a variety of techniques, all well-known in the art. One convenient method is to form a notch at the precise point of cantilever with a YAG laser. The cantilever portions are then easily mechanically cleaved to form the mirrored surfaces of the device.

Figure 4:
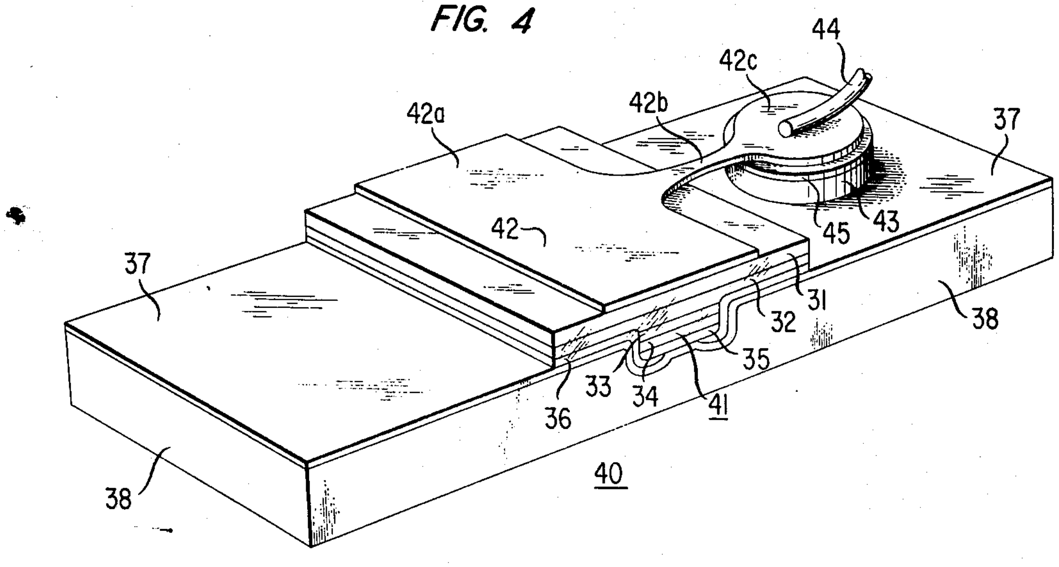
FIG. 4 depicts, in perspective, a diode laser assembly, fabricated in accordance with the invention.

In addition to reducing mechanical stresses, an advantage of the inventive approach is that photolithography enables a greater degree of control over the dimensions of the device to be exercised. For example, in the prior art, the length of the device, as shown in FIG. 4, is typically about 400 micrometers and this size is dictated by considerations of mechanical handling. However, using a photolithographic approach in combination with the physical support structure described, the length of the device may be reduced to, say, 40 micrometers. This enables single mode longitudinal operation to be achieved, which is otherwise difficult in longer lengths, and results in increased efficiency at currents well above threshold in operation of the device. The prior art devices are limited to operation below twice the threshold current. That value is dictated by considerations of device length. A reduction in device length, however, enables operation to be performed at ten times the threshold current, which results in a higher external differential quantum efficiency than presently achieved.

What is claimed is:

1. A semiconductor power dissipating device consisting of at least three semiconductor bodies, arranged symmetrically around a centrally located inert semiconductor body, all of which semiconductor bodies are fabricated on a planar heat sink and comprise in sequence:

a. a Schottky barrier layer which contacts the heat sink;

b. a GaAs active region having a carrier concentration of about $10^{15}$ atoms/cm$^3$ to $10^{17}$ atoms/cm$^3$, and which contacts the Schottky barrier;

c. a GaAs buffer region having a carrier concentration of about $10^{17}$ atoms/cm$^3$ to $10^{18}$ atoms/cm$^3$, and which contacts the active region;

d. a GaAs contact region having a carrier concentration of about $10^{18}$ atoms/cm$^3$, and which contacts the buffer region;

e. an ohmic contact layer which contacts the GaAs contact region;

f. planar beam leads extending from the central inert body to each of the remaining bodies; and g. an electrode bonded to a portion of the beam lead over the central body.

* * * * *